(12) United States Patent
Gomi et al.

(10) Patent No.: US 9,117,632 B2
(45) Date of Patent: Aug. 25, 2015

(54) CHARGED PARTICLE BEAM WRITING APPARATUS AND CHARGED PARTICLE BEAM WRITING METHOD

(71) Applicant: NuFlare Technology, Inc., Yokohama (JP)

(72) Inventors: Saori Gomi, Kanagawa (JP); Yusuke Sakai, Cupertino, CA (US)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/065,588

(22) Filed: Oct. 29, 2013

(65) Prior Publication Data

US 2014/0127914 A1 May 8, 2014

(30) Foreign Application Priority Data

Nov. 5, 2012 (JP) ................................. 2012-243807

(51) Int. Cl.
*H01L 21/26* (2006.01)
*H01J 3/14* (2006.01)
(Continued)

(52) U.S. Cl.
CPC ............. *H01J 37/3174* (2013.01); *B82Y 10/00* (2013.01); *B82Y 40/00* (2013.01); *H01L 21/263* (2013.01); *H01J 2237/31764* (2013.01)

(58) Field of Classification Search
CPC ...... H01L 21/027; B82Y 10/00; B82Y 40/00; G03F 1/78; G03F 7/2063; H01J 37/3174
USPC ......... 437/395, 935; 438/FOR. 446; 430/296, 430/492; 250/492.22; 257/E21.328
See application file for complete search history.

(56) References Cited

U.S. PATENT DOCUMENTS

| | | | | | |
|---|---|---|---|---|---|
| 4,119,854 | A | * | 10/1978 | Tanaka et al. | 250/397 |
| 6,259,106 | B1 | * | 7/2001 | Boegli et al. | 250/492.22 |
| 2002/0056813 | A1 | * | 5/2002 | Hartley et al. | 250/491.1 |

(Continued)

FOREIGN PATENT DOCUMENTS

| | | |
|---|---|---|
| JP | 2002-57083 A | 2/2002 |
| JP | 2009-088213 | 4/2009 |
| KR | 10-0276571 B1 | 12/2000 |

OTHER PUBLICATIONS

Office Action issued Aug. 29, 2014 in Korean Patent Application No. 10-2013-0131460 with English language translation.

(Continued)

*Primary Examiner* — Mark A Laurenzi
*Assistant Examiner* — Brian Turner
(74) *Attorney, Agent, or Firm* — Oblon, McClelland, Maier & Neustadt, L.L.P.

(57) ABSTRACT

A charged particle beam writing apparatus includes a map generation unit to generate a map where a parameter concerning a chip is defined for each mesh region obtained by virtually dividing a region including the chip including a plurality of figure patterns into a plurality of mesh regions, an exchange unit to, when performing at least one data processing of reversal and rotation for data of the chip, centering on the center of the chip or the center of the region including the chip, exchange parameters each being the parameter defined for each mesh region in the map, to be corresponding to the position of a figure pattern for which the data processing was performed, and a writing unit to write the figure pattern in the chip for which at least one data processing of reversal and rotation was performed on a target object with a charged particle beam.

10 Claims, 10 Drawing Sheets

(51) Int. Cl.
*H01J 37/302* (2006.01)
*H01J 37/30* (2006.01)
*G03F 7/20* (2006.01)
*H01L 21/263* (2006.01)
*H01J 37/317* (2006.01)
*B82Y 10/00* (2011.01)
*B82Y 40/00* (2011.01)

(56) References Cited

U.S. PATENT DOCUMENTS

2007/0102651 A1\* 5/2007 Yang .......................... 250/492.3

OTHER PUBLICATIONS

Office Action issued Apr. 23, 2015 in Taiwanese Patent Application No. 102138483 (with English translation).

\* cited by examiner

Exchange Mesh Values Per Column

FIG. 4A    FIG. 4B

Before Mirror Processing

After Mirror Processing

Before Mirror Processing
(Before Offset)

FIG. 7A

Before Mirror Processing
(After Offset)

FIG. 7B

After Mirror Processing

FIG. 10

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2012-243807 filed on Nov. 5, 2012 in Japan, the entire contents of which are incorporated herein by reference.

BACKGROUND OF THE INVENTION

1. Field of the Invention

The present invention relates to a charged particle beam writing apparatus and a charged particle beam writing method, and, for example, it relates to a writing apparatus and method that estimates the number of shots used for prediction of the writing time and an area density used for dose correction calculation.

2. Description of Related Art

The lithography technique that advances miniaturization of semiconductor devices is extremely important as being a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a highly precise master pattern.

Figure 9:
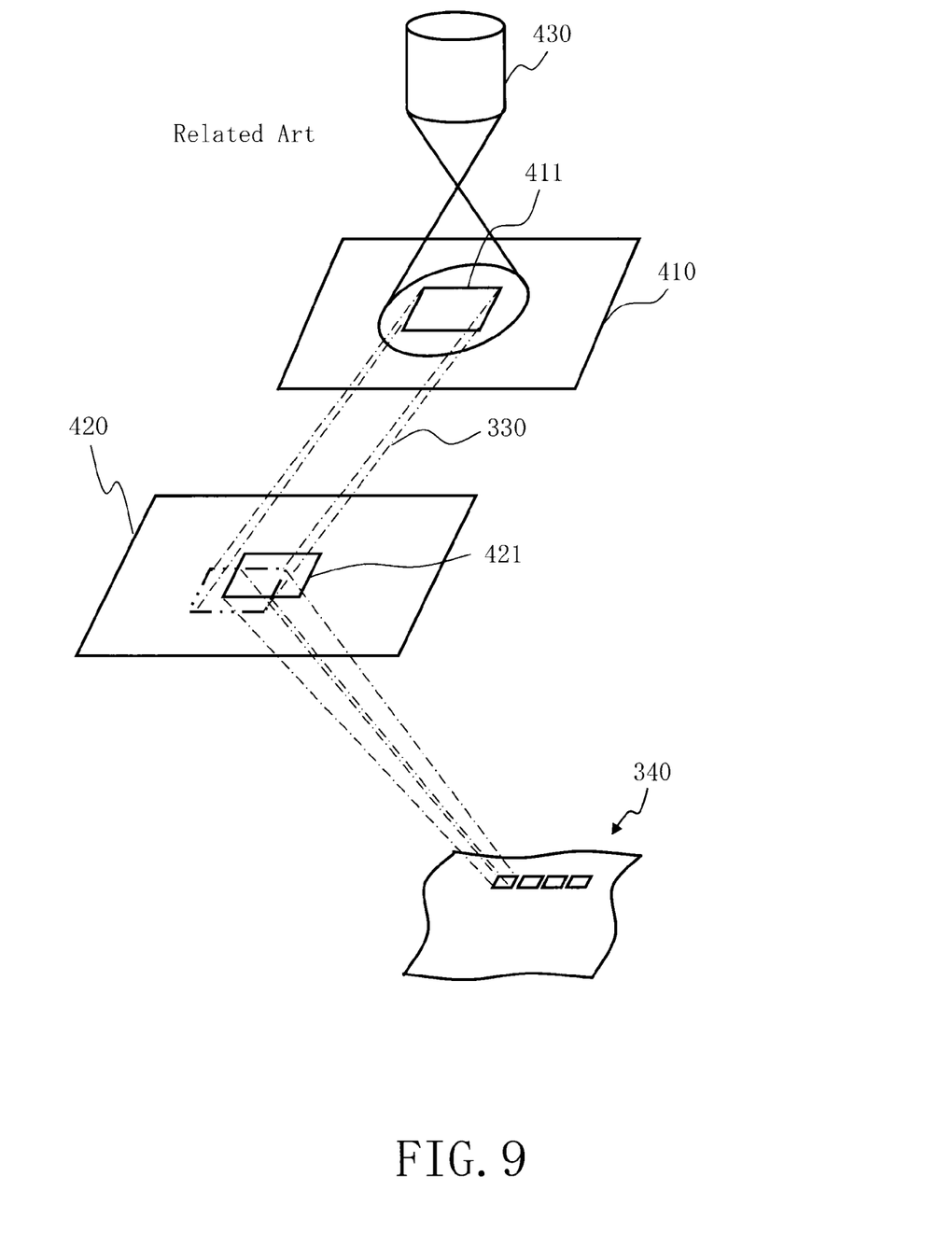
FIG. 9 is a conceptual diagram explaining operations of a variable shaped electron beam writing apparatus.

FIG. 9 is a conceptual diagram explaining operations of a variable shaped electron beam writing or "drawing" apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture plate 410 and the variable-shape opening 421 of the second aperture plate 420 is referred to as a variable shaped beam (VSB) method.

When writing a chip pattern by a writing apparatus, the time for writing the chip pattern is estimated and the estimated time is provided for the user (as disclosed, for example, in JP-A-2009-088213). Therefore, it is necessary to estimate the number of shots used for writing the chip pattern. On the other hand, in the writing apparatus, there is a case of performing mirror processing (reversal processing) or rotation processing for a chip. In such a case, it becomes necessary to change arrangement coordinates, figure codes, and the like of the data of all the cells and figure patterns in the chip.

Figure 10:
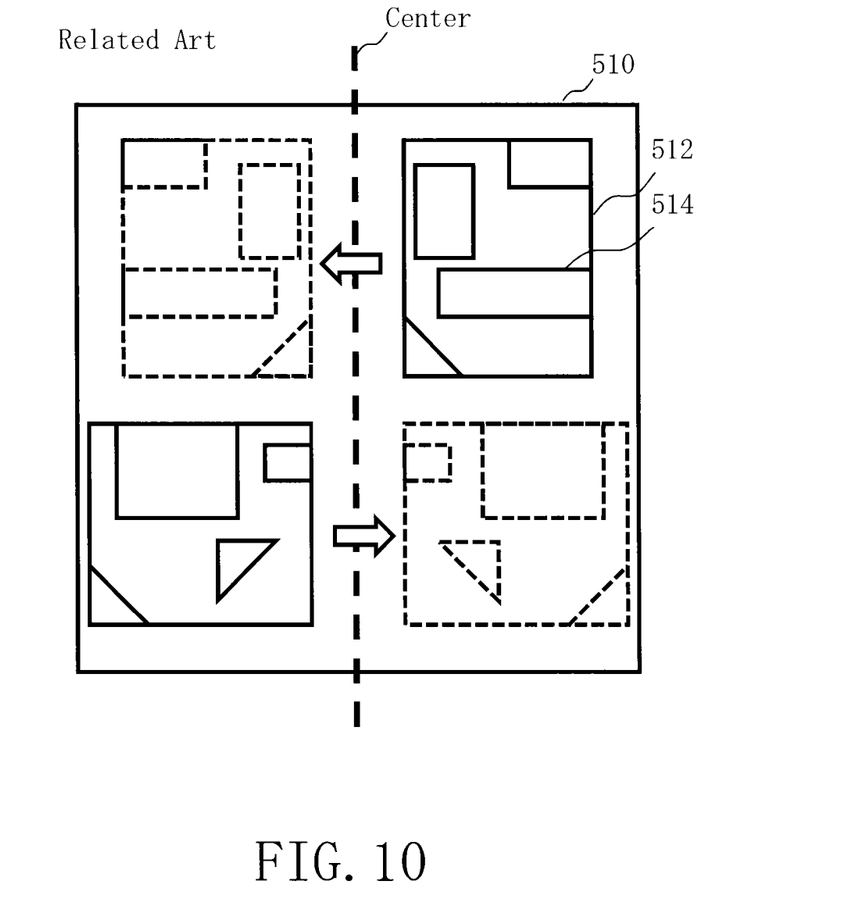
FIG. 10 is a conceptual diagram in the case of performing mirror processing for a cell and a figure pattern in a chip.

FIG. 10 is a conceptual diagram in the case of performing mirror processing for a cell and a figure pattern in a chip. In connection with miniaturization of patterns of recent days, the number of cells 512 in a chip 510 is generally a huge number. Moreover, since a large number of figure patterns 514 are arranged in the cell 512, the number of figure patterns is further enormous. Thus, in the case of performing mirror processing (reversal processing) or rotation processing, it takes an enormous amount of processing time to change arrangement coordinates, figure codes, and the like of all cell data or all figure pattern data. Consequently, there is problem that, for example, processing of estimating the number of shots and the like needs to wait for change of the cell data and all the figure pattern data for mirror processing (reversal processing) or rotation processing, which similarly causes an enormous amount of processing time. As a result, for example, when estimating a writing time before starting writing, the processing time will be significantly long.

BRIEF SUMMARY OF THE INVENTION

In accordance with one aspect of the present invention, a charged particle beam writing apparatus includes a map generation unit configured to generate a map in which a parameter concerning a chip is defined for each mesh region of a plurality of mesh regions obtained by virtually dividing a region including the chip including a plurality of figure patterns into the plurality of mesh regions, an exchange unit configured to, when performing at least one data processing of reversal and rotation for chip data of the chip, centering on one of a center of the chip and a center of the region including the chip, exchange parameters each being the parameter defined for the each mesh region in the map, to be corresponding to a position of a figure pattern for which the data processing has been performed, and a writing unit configured to write the figure pattern in the chip for which the at least one data processing of the reversal and the rotation has been performed on a target object with a charged particle beam.

In accordance with another aspect of the present invention, a charged particle beam writing method includes generating a map in which a parameter concerning a chip is defined for each mesh region of a plurality of figure patterns obtained by virtually dividing a region including the chip including a plurality of figure patterns into the plurality of mesh regions, exchanging parameters each being the parameter defined for the each mesh region in the map, when performing at least one data processing of reversal and rotation for chip data of the chip, centering on one of a center of the chip and a center of the region including the chip, to be corresponding to a position of a figure pattern for which the data processing has been performed, and writing the figure pattern in the chip for which the at least one data processing of the reversal and the rotation has been performed on a target object with a charged particle beam.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used. Furthermore, a variable-shaped electron beam writing apparatus will be described as an example of a charged particle beam apparatus.

Moreover, in the following Embodiments, there will be described a writing apparatus and method that can reduce data processing time for calculating a parameter concerning a chip modified by mirror processing or rotation processing.

First Embodiment

Figure 1:
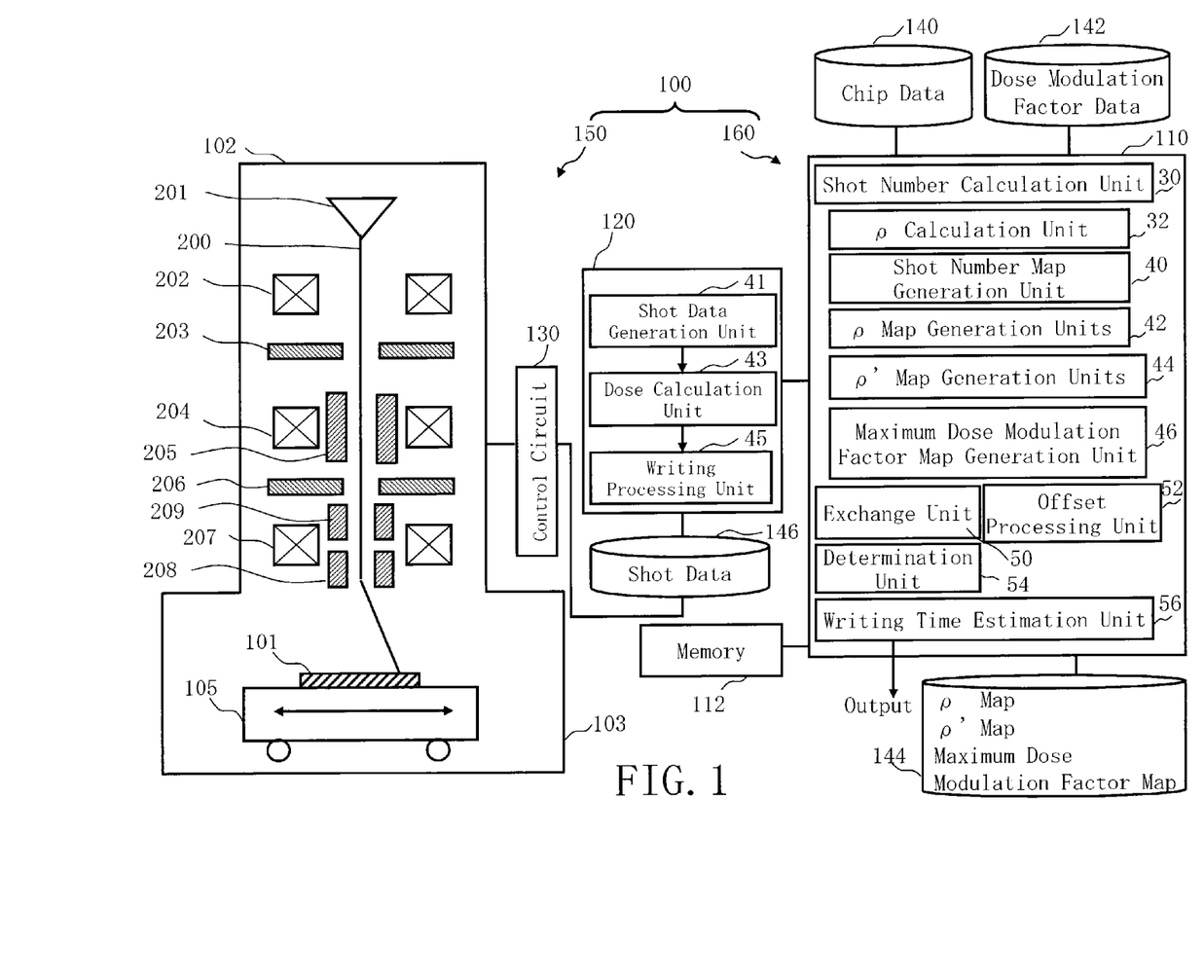
FIG. 1 is a schematic diagram showing a structure of a writing apparatus according to the first embodiment.

FIG. 1 is a schematic diagram showing a structure of a writing apparatus according to the first embodiment. In FIG. 1, a writing apparatus 100 includes a writing unit 150 and a control unit 160. The writing apparatus 100 is an example of a charged particle beam writing apparatus, and especially, an example of a variable-shaped electron beam writing apparatus. The writing unit 150 includes an electron lens barrel 102 and a writing chamber 103. In the electron lens barrel 102, there are arranged an electron gun assembly 201, an illumination lens 202, a first aperture plate 203, a projection lens 204, a deflector 205, a second aperture plate 206, an objective lens 207, a main deflector 208 and a sub-deflector 209. In the writing chamber 103, there is arranged an XY stage 105. On the XY stage 105, a target object 101, such as a mask, serving as a writing target when writing is placed. The target object 101 is, for example, an exposure mask used when manufacturing semiconductor devices. The target object 101 is, for example, a mask blank on which resist is applied and a pattern has not yet been formed.

The control unit 160 includes control computers 110 and 120, a memory 112, a control circuit 130, and storage devices 140, 142, 144, and 146 such as a magnetic disk drive. The control computers 110 and 120, the memory 112, the control circuit 130, and the storage devices 140, 142, 144, and 146 are mutually connected through a bus (not shown).

In the control computer 110, there are arranged a shot number calculation unit 30, an area density calculation unit 32, a shot number map generation unit 40, area density map generation units 42 and 44, a maximum dose modulation factor map generation unit 46, an exchange unit 50, an offset processing unit 52, a determination unit 54, and a writing time estimation unit 56. Each function such as the shot number calculation unit 30, the area density calculation unit 32, the shot number map generation unit 40, the area density map generation units 42 and 44, the maximum dose modulation factor map generation unit 46, the exchange unit 50, the offset processing unit 52, the determination unit 54, and the writing time estimation unit 56 may be configured by hardware such as an electronic circuit or by software such as a program causing a computer to implement these functions. Alternatively, it may be configured by a combination of hardware and software. Data which is input and output to/from the shot number calculation unit 30, the area density calculation unit 32, the shot number map generation unit 40, the area density map generation units 42 and 44, the maximum dose modulation factor map generation unit 46, the exchange unit 50, the offset processing unit 52, the determination unit 54, and the writing time estimation unit 56, and data being calculated are stored in the memory 112 each time.

In the control computer 120, there are arranged a shot data generation unit 41, a dose calculation unit 43, and a writing processing unit 45. Each function, such as the shot data generation unit 41, the dose calculation unit 43, and the writing processing unit 45 may be configured by hardware such as an electronic circuit or by software such as a program causing a computer to implement these functions. Alternatively, it may be configured by a combination of hardware and software. Data which is input and output to/from the shot data generation unit 41, the dose calculation unit 43, and the writing processing unit 45, and data being calculated are stored in the memory (not shown) each time.

FIG. 1 shows a structure necessary for explaining the first embodiment. Other structure elements generally necessary for the writing apparatus 100 may also be included. For example, although a multiple stage deflector namely the two stage deflector of the main deflector 208 and the sub deflector 209 is herein used for position deflection, a single stage deflector or a multiple stage deflector of three or more stages may also be used for position deflection.

In the storage device 140 (storage unit), there is stored chip data of a chip, including a plurality of cells each configured by at least one figure pattern, input from the outside the apparatus. Each figure pattern data indicating the shape, arrangement coordinates and the size of each figure pattern is defined in the chip data. In other words, each figure pattern data indicating the shape, arrangement coordinates and the size of each figure pattern in a chip including a plurality of figure patterns is defined in the chip data.

In the storage device 142 (storage unit), there is stored dose modulation factor data which is set outside the apparatus and input thereinto from the outside.

For writing a figure pattern by the writing apparatus 100, it is necessary to divide each figure pattern defined in the chip data such that a divided figure pattern has a size to be irradiated by one beam shot. First, the number of shots for writing the chip is estimated by calculation by the control computer 110. Then, a writing time for writing the chip by using the calculated number of shots is estimated. On the other hand, a pattern area density $\rho$ in a region of a predetermined size is calculated by the control computer 110. It is preferable to use the pattern area density $\rho$ for correcting a dose in writing. Further, it is preferable to calculate a pattern area density $\rho'$ in each mesh region per dose modulation factor by the control computer 110. Moreover, it is preferable to calculate a maximum dose modulation factor in each mesh region by the control computer 110. The number of shots, the pattern area density $\rho$, the pattern area density $\rho'$ in each mesh region per dose modulation factor, and the maximum dose modulation factor are examples of parameters concerning a chip used as a writing target.

Figure 2:
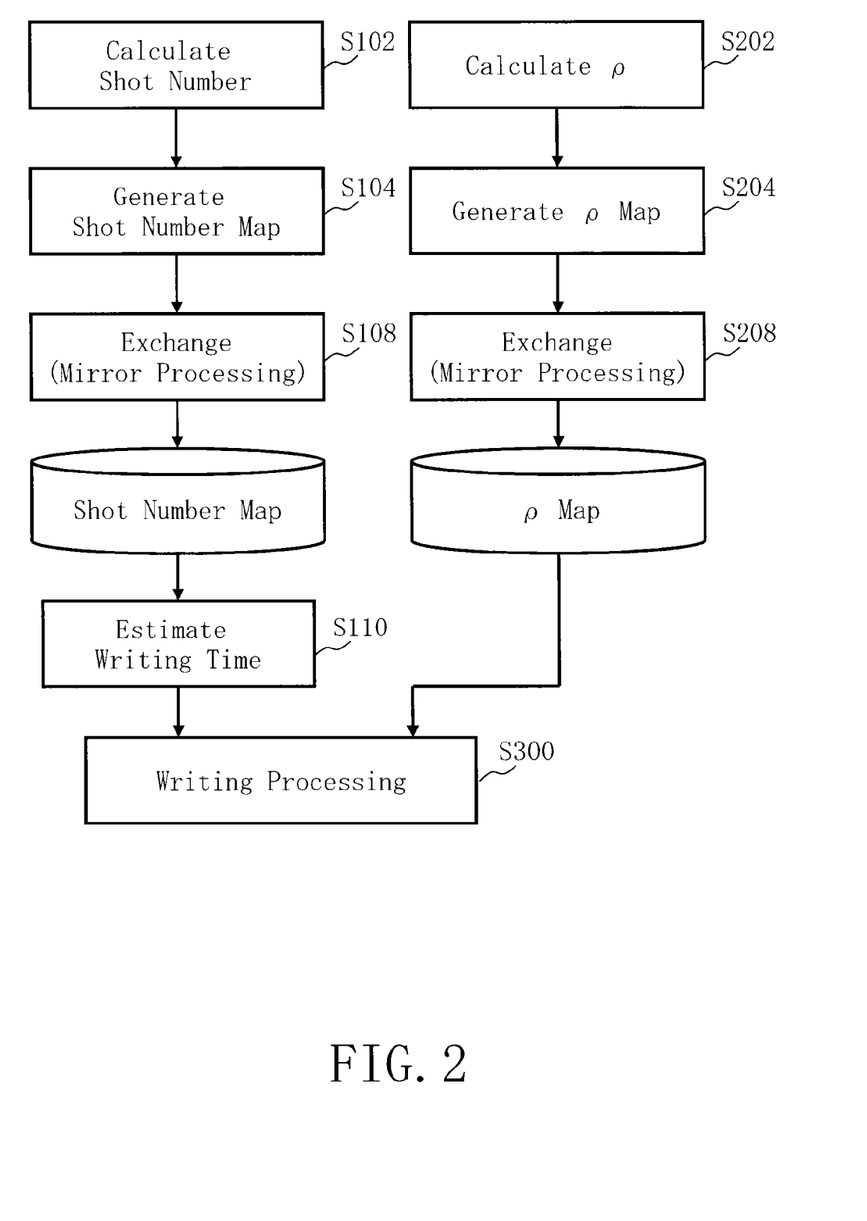
FIG. 2 is a flowchart showing main steps of a charged particle beam writing method according to the first embodiment.

FIG. 2 is a flowchart showing main steps of a charged particle beam writing method according to the first embodiment. FIG. 2 shows a flowchart relating to, for example, the number of shots and the area density ρ in the parameters described above.

In a shot number calculation step (S102), for each mesh region obtained by virtually dividing a region including a chip including a plurality of figure patterns into a plurality of mesh-like regions, the shot number calculation unit 30 calculates the number of shots with respect to the chip. A chip is configured by a plurality of cells, and each cell is configured by at least one or more figure patterns. First, each figure pattern data in chip data is input, and, each figure pattern is divided into a plurality of shot figures each having a size which can be irradiated by one shot of the electron beam 200. Thereby, the number of shots of the figure pattern concerned can be calculated. Then, for each cell, the number of shots of the figure pattern arranged therein is collectively calculated. Furthermore, the number of shots of each mesh region can be calculated by collecting the number of shots of a cell arranged for each mesh region obtained by dividing a chip into a plurality of mesh regions each being a predetermined size.

In a shot number map generation step (S104), the shot number map generation unit 40 generates a map in which a parameter concerning the chip described above is defined for each mesh region obtained by virtually dividing the region including the chip into a plurality of mesh-like regions. Here, a map in which the number of shots is defined for each mesh region is generated, as an example. The shot number map generation unit 40 is an example of the map generation unit.

As described above, in the writing apparatus 100, there is a case of performing mirror processing (reversal processing) or rotation processing for a chip. In that case, it becomes necessary to alter arrangement coordinates, figure codes, and the like in the data of all the cells and figure patterns in the chip. Therefore, when performing mirror processing (reversal processing) or rotation processing, it takes an enormous amount of processing time to alter arrangement coordinates, figure codes, and the like of all the cell data or all the figure pattern data. In the case of generating a shot number map after performing mirror processing (reversal processing) or rotation processing, if it has to wait until the arrangement coordinates, figure codes, and the like in the data of all the cells and figure patterns in a chip have been altered, a huge amount of processing time will be taken. Then, according to the first embodiment, when generating a shot number map after performing the mirror processing (reversal processing) or rotation processing, the numbers of shots defined for the mesh region described above are exchanged per mesh region. Thereby, processing time can be greatly shortened. Specifically, it is executed as follows:

In an exchange step (S108), the exchange unit 50 exchanges the parameters each defined for each mesh region in a map, to be corresponding to the position of the figure pattern for which data processing, such as mirror processing (reversal processing) or rotation processing, has been performed.

Figure 3A:
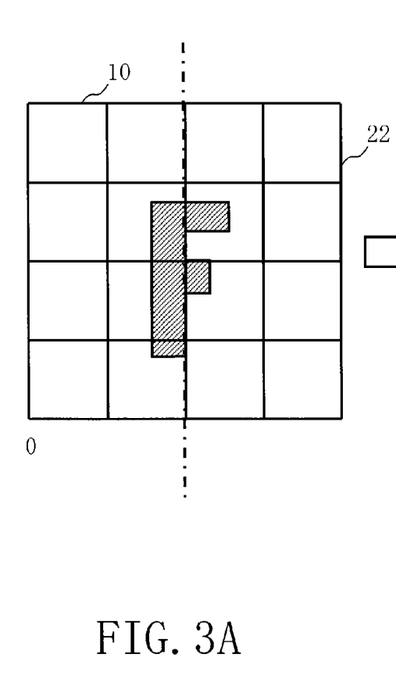
FIGS. 3A and 3B are conceptual diagrams explaining an example of a chip and a mesh region, and a method of performing mirror processing according to the first embodiment.
Figure 3B:
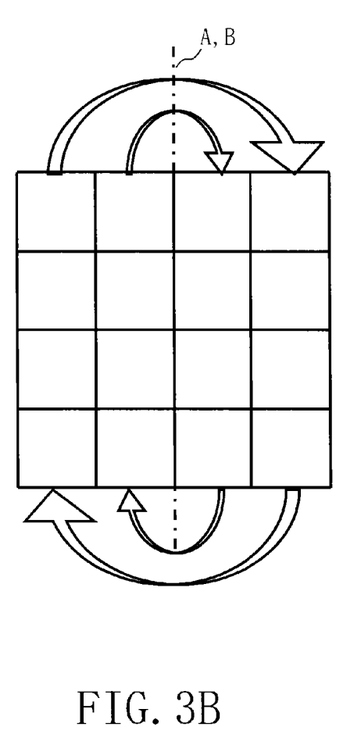

FIGS. 3A and 3B are conceptual diagrams explaining an example of a chip and a mesh region, and a method of performing mirror processing according to the first embodiment. FIG. 3A shows the case of writing one chip, for example. In such a case, a mesh region can be obtained by virtually dividing a chip region 10 into a plurality of mesh regions 22 while defining the reference position (for example, lower left corner) of the chip concerned as the origin O. Then, for example, in performing mirror processing for data on the right and left sides, centering on the chip center A or the mesh center B, as shown in FIG. 3B, the numbers of shots defined for the mesh regions 22 on the right and left sides are exchanged per mesh region 22 while centering on the centerline (mesh center B: an example of a region center) of a plurality of mesh regions 22. Here, the case of the chip center A and the mesh center B being the same is shown, as an example. Even when there is a deviation between the chip center A and the mesh center B, it is preferable to exchange, per mesh region 22, the numbers of shots defined for the mesh regions 22 on the right and left sides while centering on the centerline (mesh center B) of the mesh region 22. Here, mesh values may be exchanged per vertical column. However, in that case, an error may be generated. It is preferable for the size of the mesh region when defining the number of shots to be about tens of μm, for example. It is more preferable to be about 20 to 30 μm, for example.

Figure 4A:
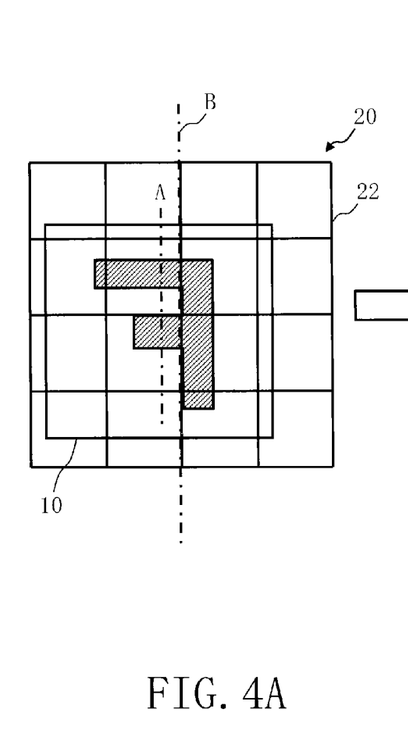
FIGS. 4A and 4B are conceptual diagrams explaining another example of a chip and a mesh region, and a method of performing mirror processing according to the first embodiment.
Figure 4B:
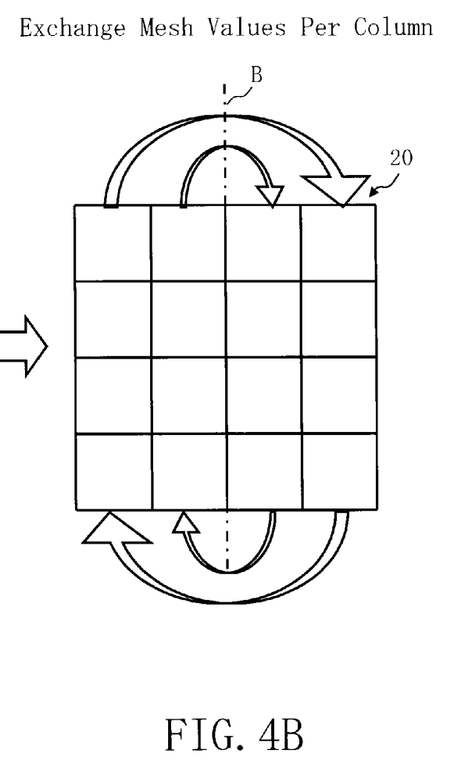

FIGS. 4A and 4B are conceptual diagrams explaining another example of a chip and a mesh region, and a method of performing mirror processing according to the first embodiment. FIG. 4A shows the case of writing a plurality of chips, for example. In such a case, merge processing is performed for a plurality of chips, and a mesh region can be obtained by virtually dividing a region 20, being a circumscribed quadrangle of a plurality of chips and including a chip 10 concerned, into a plurality of mesh regions 22 while defining the reference position (for example, lower left corner) of the region 20 as the origin O. Then, for example, in performing mirror processing for data on the right and left sides, centering on the chip center A or the mesh center B, as shown in FIG. 4B, the numbers of shots, defined for the mesh regions 22 on the right and left sides centering on the centerline (mesh center B) of a plurality of mesh regions 22 which overlap with at least a part of the chip 10 concerned, are exchanged per mesh region 22. In such a case, generally, there exists a deviation between the chip center A and the mesh center B. Even in that case, it is preferable to exchange, per mesh region 22, the numbers of shots defined for the mesh regions 22 on the right and left sides while centering on the centerline (mesh center B) of a plurality of the mesh regions 22 which overlap with at least a part of the chip 10 concerned. Here, mesh values are to be exchanged per vertical column. However, in that case, an error may be generated.

Now, the processing time in the case of generating a shot number map after performing mirror processing and the processing time in the case of generating a shot number map without performing mirror processing will be compared, for example.

(A1) Case of performing mirror processing for chip data:

Data processing time="a" (map generation time without mirror processing)+"b" (mirror processing time for chip data)+a' (map generation time after mirror processing)

(B1) Case of the first embodiment:

Data processing time="a" (map generation time without mirror processing)+"c" (mesh value exchange time)

The processing time in the case of generating only a shot number map after performing mirror processing will be compared, for example.

(A2) Case of performing mirror processing for chip data:

Data processing time="b" (mirror processing time for chip data) +"a'" (map generation time after mirror processing)

(B2) Case of the first embodiment:

Data processing time="a" (map generation time without mirror processing+"c" (mesh value exchange time)

When comparing "b" (mirror processing time for chip data) and "c" (mesh value exchange time), the processing time of "c" (mesh value exchange time) is greatly shorter. For example, when a shot figure of 0.35 μm width is arranged at the area density of 50% in a chip of 100 μm square, the number of figures is 40470. If the number of mesh regions is 100, since 40470/100≈400, the processing time can be reduced to about ¹⁄₄₀₀ according to the first embodiment. When generating both a shot number map after performing mirror processing and a shot number map without performing mirror processing, the map generation time "a'" after mirror processing can also be further shortened according to the first embodiment.

In a writing time estimation step (S110), the writing time estimation unit 56 estimates a writing time for writing the chip concerned based on the number of shots of each mesh region 22. The writing time estimation unit 24 calculates a total writing time Tes for writing a chip on the target object 101 by using the following equation (1), for example.

$$Tes = \alpha_1 \cdot N_{total} + \beta_1 \qquad (1)$$

Here, the coefficient $\alpha_1$ indicates a time (shot cycle) required for per shot. For example, the coefficient $\alpha_1$ can be expressed by the sum of a time $t_1$ for obtaining a required dose D and a time $t_2$ (settling time) for deflecting the electron beam 200. If defining a current density as J, $t_1 = D/J$. A coefficient $\beta_1$ indicates a sum of necessary time required when moving the XY stage 105 to the writing start position of the next stripe region after writing one stripe region. These coefficients $\alpha_1$ and $\beta_1$ are to be set as parameters in advance.

Next, pattern area density will be described.

In a pattern area density calculation step (S202), for each mesh region obtained by virtually dividing a region including a chip including a plurality of figure patterns into a plurality of mesh-like regions, the area density calculation unit 32 calculates a pattern area density ρ with respect to the chip. As described above, a chip is configured by a plurality of cells, and each cell is configured by at least one or more figure patterns. Then, for example, for each cell-divided region (mesh region) obtained by dividing a cell into mesh-like regions, the pattern area density ρ of a cell-divided region concerned is calculated by summing the areas of shot figures allotted to the cell-divided regions. Furthermore, for each mesh region obtained by dividing a chip into mesh regions of a predetermined size, the pattern area density ρ of each mesh region is calculated by summing the pattern area densities ρ of the cell arranged. It is preferable for the size of the mesh region when defining the pattern area density ρ to be about tens of μm, for example. It is more preferable to be about 10 to 20 μm, for example.

In a pattern area density map generation step (S204), the area density map generation unit 42 generates a map in which a parameter concerning the chip described above is defined for each mesh region obtained by virtually dividing the region including the chip into a plurality of mesh-like regions. Here, a map in which the pattern area density ρ is defined for each mesh region is generated, as an example. The area density map generation unit 42 is an example of the map generation unit. The area density map is stored in the storage device 144.

As described above, in the writing apparatus 100, there is a case of performing mirror processing (reversal processing) or rotation processing for a chip. In that case, as described above, it takes an enormous amount of processing time to alter arrangement coordinates, figure codes, and the like of all the cell data or all the figure pattern data. Therefore, in the case of generating an area density map after performing mirror processing (reversal processing) or rotation processing, if it has to wait until the arrangement coordinates, figure codes, and the like in the data of all the cells and figure patterns in a chip have been changed, a huge amount of processing time will be taken. Then, according to the first embodiment, when generating an area density map after performing mirror processing (reversal processing) or rotation processing, similarly to the case of the shot number map, the pattern area densities ρ each defined for each mesh region described above are exchanged per mesh region. Thereby, the processing time can be greatly shortened as well as the case of the shot number map.

In an exchange step (S208), the exchange unit 50 exchanges the parameters (pattern area densities ρ) each defined for each mesh region in a map, to be corresponding to the position of the figure pattern for which data processing, such as mirror processing (reversal processing) or rotation processing, has been performed. The content of the exchange processing is the same as the case of the shot number map.

As to a pattern area density ρ' for each dose modulation factor, the area density map generation unit 44 reads a dose modulation factor from the storage device 142, and generates a pattern area density ρ' map for each dose modulation factor. The generation method may be the same as that of the pattern area density map generation step (S204). As to a maximum dose modulation factor, the maximum dose modulation factor map generation unit 46 reads a dose modulation factor from the storage device 142, selects the maximum dose modulation factor for each mesh region obtained by virtually dividing a region including a chip into a plurality of mesh-like regions, and defines it for each mesh region. Thereby, a maximum dose modulation factor map is generated. The generated pattern area density ρ' map for each dose modulation factor and the maximum dose modulation factor map are stored in the storage device 144. The method of data processing, such as mirror processing (reversal processing) and rotation processing, for the pattern area density ρ' map for each dose modulation factor, the maximum dose modulation factor map, and the like is the same as that of the case of the shot number map described above. Thereby, processing time can be greatly shortened as well as the case of the shot number map.

When performing writing with an electron beam, a chip region is divided into a plurality of strip-like stripe regions, for example, in the y direction, each having a predetermined width. Writing processing is executed per stripe region. When writing on the target object 101 while the XY stage 105 is continuously moved, for example, in the x direction, the electron beam 200 irradiates one stripe region of the target object 101, which is obtained by virtually dividing the writing (exposure) surface into a plurality of strip-like stripe regions where the electron beam 200 is deflectable. The movement of the XY stage 105 in the x direction is a continuous movement, and simultaneously, the shot position of the electron beam 200 is made to follow the movement of the stage. Writing time can be shortened by performing the continuous movement. After writing one stripe region, the XY stage 105 is moved in the y direction by step feeding, and then, returned in the x direction (this time, reverse direction) to the writing starting position of the next stripe region. From that position, the writing operation of the next stripe region is started. Thus, the writing operation is performed by forward (Fwd)-forward (Fwd) movement. It is possible to avoid positional deviation, generated between going and returning of the stage system, by proceeding in the forward (Fwd)-forward (Fwd) movement. However, it is also acceptable to perform forward (Fwd)-back forward (Bwd) movement, that is, after finishing writing one stripe region, the XY stage 105 is moved in the y direction by step feeding, and then, the writing operation of the next stripe region is performed in the x direction (this time, reverse direction). In that case, by performing the writing operation in a zigzag manner for each stripe region, the movement time of the XY stage 105 can be shortened.

It is possible to estimate a writing time highly precisely by estimating the writing time based on highly accurate number of shots as described above. The estimated writing time is output to, for example, a monitor, a printer, a storage device, which are not shown, or the outside to be recognized by a user.

After estimating the writing time, writing processing is actually proceeded for the chip.

In a shot data generating step, the shot data generation unit 41 reads out chip data from the storage device 140, performs data conversion processing of several steps, and generates shot data unique to the apparatus. As described above, for writing a figure pattern by the writing apparatus 100, it is necessary to divide each figure pattern defined in the writing data so as to have the size which can be irradiated by one beam shot. Therefore, for actual writing, the shot data generation unit 41 divides each figure pattern so as to have the size which can be irradiated by one beam shot, in order to generate a shot figure. Then, shot data is generated for each shot figure. In the shot data, figure data, such as a figure type, a figure size, and an irradiation position, is defined. The generated shot data is stored in the storage device 146.

In a dose calculation step, the dose calculation unit 43 calculates a dose for each mesh region of a predetermined size. The dose can be calculated by multiplying a base dose Dbase by a correction coefficient. It is preferable to use as a correction coefficient, for example, a fogging-effect correction irradiation coefficient Df($\rho$) which is for correcting a fogging effect. The fogging-effect correction irradiation coefficient Df($\rho$) is a function depending upon a pattern area density $\rho$ of a mesh of meshes used in calculation for correcting the fogging-effect. Since the influence radius of the fogging-effect is several mm, it is preferable for the size of the mesh for correcting the fogging-effect to be approximately 1/10 of the influence radius, for example, to be 1 mm, in order to perform correction calculation. As the pattern area density $\rho$ of the mesh for fogging, the pattern area density described above can be used. In addition, for correcting a dose, it is also preferable to use a correction coefficient for proximity effect correction, a correction coefficient for loading correction, etc. Also in such correction, the pattern area density in the mesh region for each calculation can be used. As the pattern area density, the pattern area density described above may also be used. The dose calculation unit 43 generates a dose map in which each calculated dose is defined for each region. As described above, according to the first embodiment, since a highly precise pattern area density $\rho$ can also be obtained as a pattern area density $\rho$ used when performing dose correction, it is possible to calculate a highly accurately corrected dose. The generated dose map is stored in the storage device 146.

In a writing processing step (S300), the writing processing unit 45 outputs a control signal in order to make the control circuit 130 perform writing processing. The control circuit 130 inputs shot data and a dose map from the storage device 146, and controls the writing unit 150 based on the control signal, through the writing processing unit 45. The writing unit 150 writes a figure pattern in a chip, for which at least one data processing of reversal and rotation has been performed, on the target object 101 with the electron beam 200. Specifically, the operation is performed as follows:

The electron beam 200 emitted from the electron gun 201 (emission unit) irradiates the entire first aperture plate 203 having a quadrangular opening by the illumination lens 202. At this point, the electron beam 200 is shaped to be a quadrangle. Then, after having passed through the first aperture plate 203, the electron beam 200 of a first aperture image is projected onto the second aperture plate 206 by the projection lens 204. The first aperture image on the second aperture plate 206 is deflection-controlled by the deflector 205 so as to change the shape and size of the beam to be variably shaped. After having passed through the second aperture plate 206, the electron beam 200 of a second aperture image is focused by the objective lens 207 and deflected by the main deflector 208 and the sub deflector 209, and reaches a desired position on the target object 101 on the XY stage 105 which moves continuously. FIG. 1 shows the case of using a multiple stage deflection, namely the two stage deflector of the main and sub deflectors, for position deflection. In such a case, what is needed is to deflect the electron beam 200 of a shot concerned to the reference position of a subfield (SF), which is obtained by further dividing the stripe region virtually, by the main deflector 208 while following the stage movement, and to deflect the beam of the shot concerned to each irradiation position in the SF by the sub deflector 209.

According to the first embodiment, it is possible to reduce the data processing time for calculating a parameter concerning a chip which is altered by mirror processing or rotation processing. As a result, the writing time can be shortened.

Second Embodiment

When performing mirror processing at the chip center A, and in the case of performing data exchange of a shot number map at the mesh center B, there occurs a deviation as described in the first embodiment. In the second embodiment, a method of correcting such deviation will be described. The apparatus structure according to the second embodiment is the same as that of FIG. 1. The content of the second embodiment is the same as that of the first embodiment except what is particularly described below.

Figure 5A:
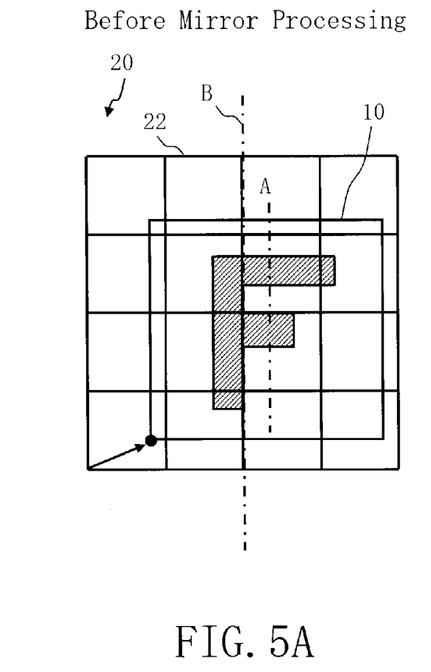
FIGS. 5A and 5B are conceptual diagrams explaining an example of a chip and a mesh region, and a method of performing mirror processing according to the second embodiment.
Figure 5B:
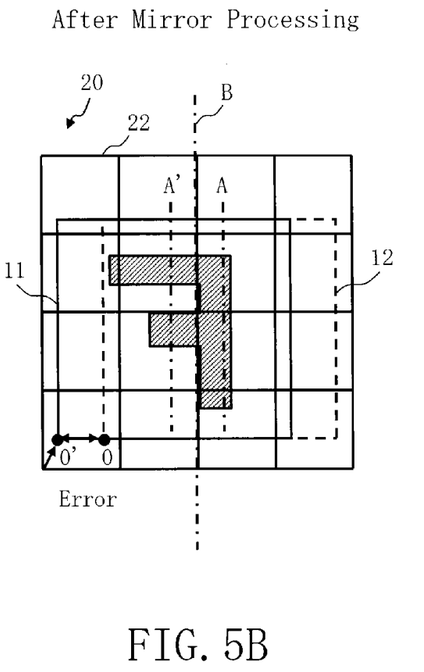

FIGS. 5A and 5B are conceptual diagrams explaining an example of a chip and a mesh region, and a method of performing mirror processing according to the second embodiment. FIG. 5A shows the case where the chip 10 concerned is arranged in the region 20, and there is a deviation between the chip center A and the mesh center B. If mirror processing is performed centering on the mesh center B in this structure, as shown in FIG. 5B, a deviation occurs between the chip center A' of the chip 11 for which mirror processing has been performed and the chip center A of the chip 12 in the case of performing mirror processing centering on the chip center A. Therefore, when maintaining the state where mirror processing of exchanging mesh values, centering on the mesh center B, has been performed, the map does not become highly precise. Then, such a deviation is to be corrected according to the second embodiment.

Figure 6:
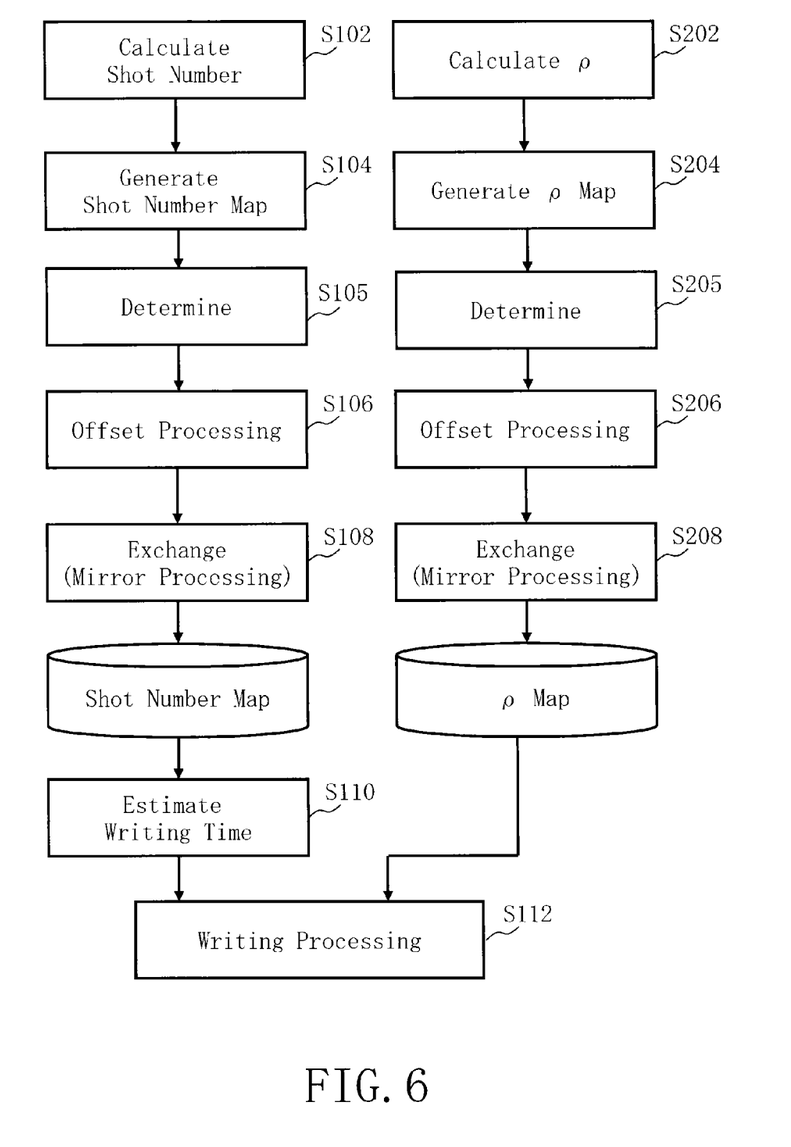
FIG. 6 is a flowchart showing main steps of a charged particle beam writing method according to the second embodiment.

FIG. 6 is a flowchart showing main steps of a charged particle beam writing method according to the second embodiment. FIG. 6 is the same as FIG. 2 except that a determination step (S105) and an offset processing step (S106) are added between the shot number map generation step (S104) and the exchange step (S108), and a determination step (S205) and an offset processing step (S206) are added between an area density map generation step (S204) and an exchange step (S208).

In the determination step (S105) (or S205 in the case of the area density map), when performing at least one data processing of reversal and rotation for the chip data of the chip 10 concerned, centering on the mesh center B (region center), the determination unit 54 determines whether a difference Δ between the reference positions O and O' of the chip before and after the data processing is within an acceptable value L. If the difference Δ is within the acceptable value L, it goes to the exchange step (S108) (or S208 in the case of the area density map). If the difference Δ is not within the acceptable value L, it goes to the offset processing step (S106) (or S206 in the case of the area density map). By performing the determination step, the offset processing time can be shortened when an error is within the acceptable value.

In the offset processing step (S106) (or S206 in the case of the area density map), when at least one data processing of reversal and rotation has been performed for the chip data of the chip 10 concerned, centering on the mesh center B (region center), the offset processing unit 52 offsets the chip position so that the chip center A may not deviate from its position of before the data processing. When the difference Δ between the reference positions of the chip before and after the data processing, such as reversal and rotation, exceeds the acceptable value L, the offset processing unit 52 offsets the chip position.

Figure 7A:
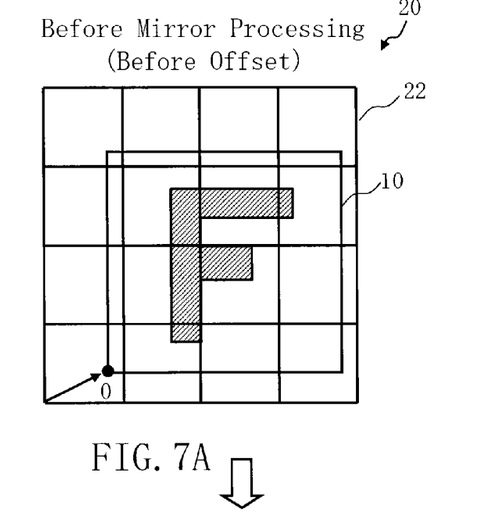
FIGS. 7A to 7C are conceptual diagrams explaining offset processing according to the second embodiment.
Figure 7B:
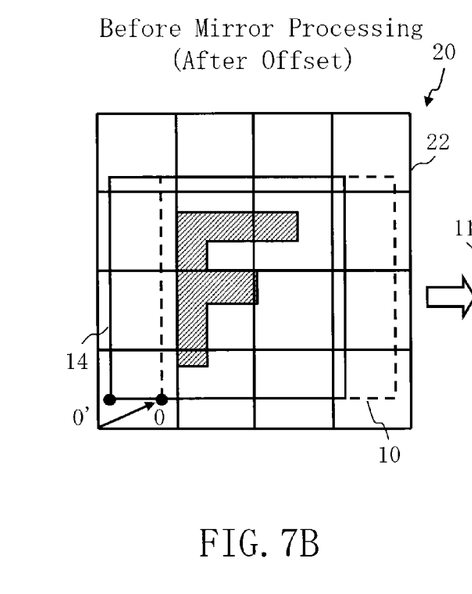

FIGS. 7A to 7C are conceptual diagrams explaining offset processing according to the second embodiment. FIG. 7A shows the arrangement relation among the region 20, the position of the chip 10 in the region 20, and the mesh region 22 in the state of before performing mirror processing, for example. If performing reversal processing centering on the mesh center B (region center) in the state of FIG. 7A, a deviation occurs between the chip center A' of the chip 11 for which mirror processing has been performed and the chip center A of the chip 12 in the case of performing mirror processing centering on the chip center A, as shown in FIG. 5B. Then, as shown in FIG. 7B, offset processing is executed for the chip position in advance so that the chip center A of after mirror processing may not deviate from its position before the data processing. As to the amount of offset, the position of the chip 10 before performing mirror processing is offset to the position of a chip 14 by a difference D between the reference positions O and O' of the chip before and after data processing.

Figure 7C:
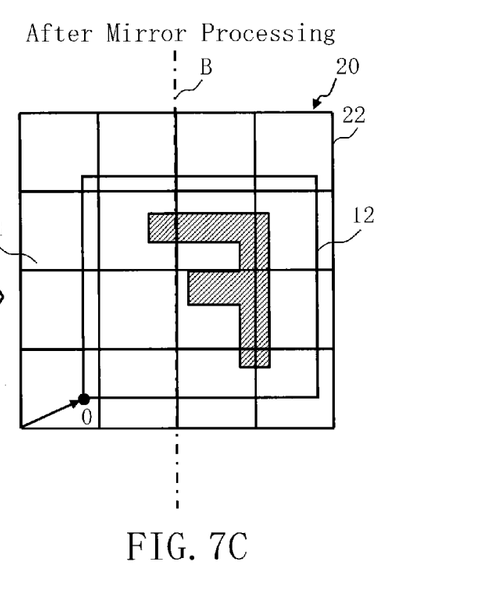

In the exchange step (S108) as described above, if at least one data processing of reversal and rotation is performed for the chip data of the chip 10 concerned, centering on the mesh center B (region center), as shown in FIG. 7C, the positions of the chip center A before and after the data processing coincide with each other. Thereby, compared with the first embodiment, data conversion processing of higher precision can be achieved. The same offset processing can be applied to the area density map as well as the shot number map. Therefore, description is omitted with respect to the area density map.

According to the second embodiment, data processing time for calculating a parameter concerning a chip which is altered by mirror processing or rotation processing can be reduced. In that case, data conversion processing of higher precision can be performed compared with the first embodiment.

As described above, although the case of performing mirror processing of a left right reversal is described as data processing in the above embodiments, it is not limited thereto.

Figure 8A:
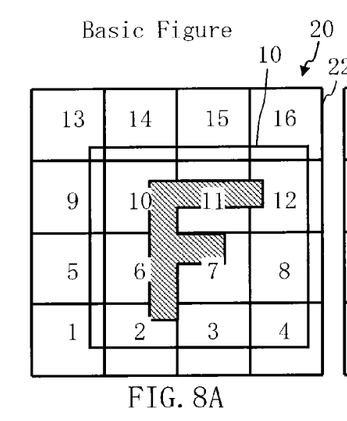
FIGS. 8A to 8H show examples of mirror processing and rotation processing in each embodiment.
Figure 8B:
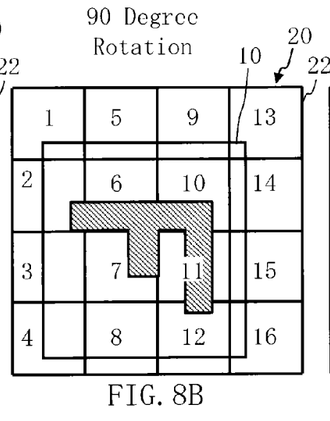
Figure 8C:
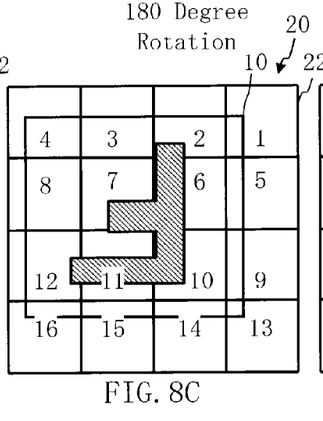
Figure 8D:
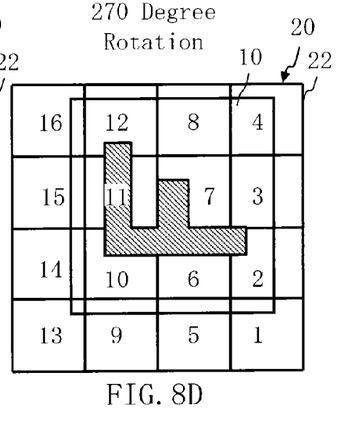
Figure 8E:
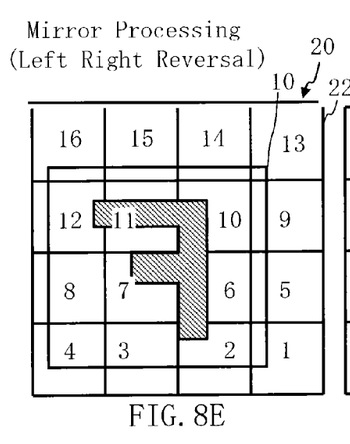
Figure 8F:
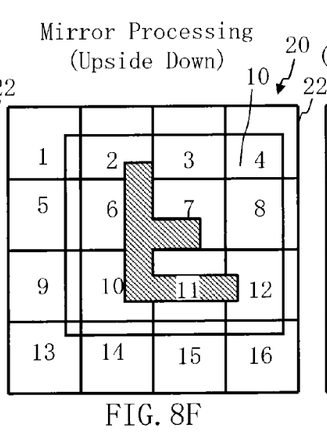
Figure 8G:
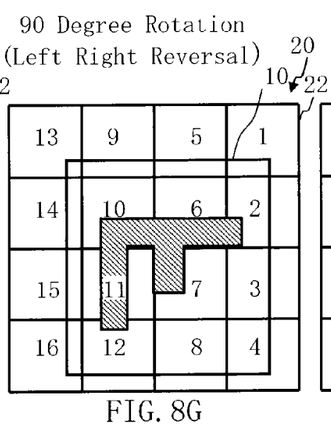
Figure 8H:
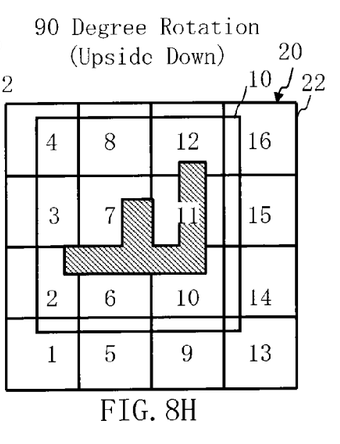

FIGS. 8A to 8H show examples of mirror processing and rotation processing in each embodiment. FIG. 8A shows the chip 10 serving as a basis, the region 20 including the chip 10, and the mesh region 22 obtained by dividing the region 20. The numbers from 1 to 16 in the mesh regions 22 are for identifying each mesh region 22. In FIG. 8A, the number of each mesh region 22 is defined in the direction of left to right and lower to higher. FIG. 8B shows the processing of a 90-degree clockwise rotation. In this case, it is rotated in the clockwise direction by 90°, centering on the mesh center common to the mesh regions 22 indicated by 6, 7, 10, and 11. Each mesh value is to be changed to the position similarly rotated in the clockwise direction by 90°, centering on the mesh center. FIG. 8C shows the processing of a 180-degree rotation. FIG. 8D shows the processing of a 270-degree clockwise direction rotation. FIG. 8E shows the processing of a left right reversal centering on the center of the meshes on the right and left sides. FIG. 8F shows the processing of upside down centering on the center of the meshes on the upper and lower sides. FIG. 8G shows the processing of a left right reversal centering on the center of the meshes on the right and left sides and a 90-degree clockwise rotation. FIG. 8H shows the processing of upside down centering on the center of the meshes on the upper and lower sides and a 90-degree clockwise rotation. In any of these cases, parameters each defined for each mesh region 22 of the map are exchanged to be corresponding to the position of the figure pattern for which data processing has been performed.

Thus, as described above, the processing time of data process of at least one of mirror processing and rotation processing can be greatly shortened.

The embodiment has been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a map generation unit configured to generate a map in which a parameter concerning a chip is defined for each mesh region of a plurality of mesh regions obtained by virtually dividing a region including the chip including a plurality of figure patterns into the plurality of mesh regions, the plurality of mesh regions including a region in which a plurality of shots of a charged particle beam are performed;
an exchange unit, when performing one of data processing of reversal and rotation for chip data of the chip, centering on one of a center of the chip and a center of the region including the chip, configured to exchange parameters each being the parameter defined for the each mesh region in the map, to be corresponding to a position of a figure pattern for which the data processing has been performed, the parameters being exchanged for each other between corresponding mesh regions; and a writing unit configured to write the figure pattern in the chip for which the one of data processing of the reversal and the rotation has been performed on a target object with a charged particle beam.

2. The apparatus according to claim 1, wherein one of a number of shots of the charged particle beam used when performing writing in the each mesh region, a pattern area density of the each mesh region, a pattern area density in the each mesh region for each dose modulation factor for modulating a dose, the dose modulation factor being set outside the apparatus and input thereinto from the outside, and a maximum dose modulation factor of the each mesh region is used as the parameter.

3. The apparatus according to claim 1, further comprising:
an offset processing unit, when the one of data processing of the reversal and the rotation has been performed for the chip data of the chip, centering on the center of the region including the chip, configured to offset a position of the chip so that the center of the chip may not deviate from its position of before the data processing,
wherein, in a state where the position of the chip has been offset, the exchange unit exchanges the parameters each defined for the each mesh region in the map, to be corresponding to the position of the figure pattern for which the data processing has been performed.

4. The apparatus according to claim 3, further comprising:
a determination unit, when performing one of data processing of the reversal and the rotation for the chip data of the chip, centering on the center of the region including the chip, configured to determine whether a difference between reference positions of the chip before and after the data processing is within a value,
wherein, when the difference between the reference positions of the chip before and after the data processing exceeds the value, the offset processing unit offsets the position of the chip.

5. The apparatus according to claim 1, wherein the map generation unit includes a shot number map generation unit configured to generate a map in which a number of shots is defined for the each mesh region.

6. The apparatus according to claim 1, wherein the map generation unit includes an area density map generation unit configured to generate a map in which a pattern area density is defined for the each mesh region.

7. The apparatus according to claim 1, further comprising:
a storage device configured to store dose modulation factors for modulating a dose, the dose modulation factors being set outside the apparatus and input thereinto from the outside,
wherein the map generation unit includes an area density map generation unit configured to read each dose modulation factor from the storage device and generate a pattern area density map for the each dose modulation factor.

8. The apparatus according to claim 1, further comprising:
a storage device configured to store dose modulation factors for modulating a dose, the dose modulation factors being set outside the apparatus and input thereinto from the outside,
wherein the map generation unit includes a maximum dose modulation factor map generation unit configured to select a maximum dose modulation factor for the each mesh region, and generates a maximum dose modulation factor map in which the maximum dose modulation factor is defined for the each mesh region.

9. A charged particle beam writing method comprising:
generating a map in which a parameter concerning a chip is defined for each mesh region of a plurality of mesh regions obtained by virtually dividing a region including the chip including a plurality of figure patterns into the plurality of mesh regions, the plurality of mesh regions including a region in which a plurality of shots of a charged particle beam are performed;
exchanging parameters each being the parameter defined for the each mesh region in the map, when performing one of data processing of reversal and rotation for chip data of the chip, centering on one of a center of the chip and a center of the region including the chip, to be corresponding to a position of a figure pattern for which the data processing has been performed, the parameters being exchanged for each other between corresponding mesh regions; and
writing the figure pattern in the chip for which the one of data processing of the reversal and the rotation has been performed on a target object with a charged particle beam.

10. The method according to claim 9, wherein one of a number of shots of the charged particle beam used when performing writing in the each mesh region, a pattern area density of the each mesh region, a pattern area density in the each mesh region for each dose modulation factor for modulating a dose, and a maximum dose modulation factor of the each mesh region is used as the parameter.

* * * * *